(12) United States Patent
Hong et al.

(10) Patent No.: US 11,092,994 B1
(45) Date of Patent: Aug. 17, 2021

(54) CLOCK COMPENSATION CIRCUIT

(71) Applicant: SK hynix Inc., Icheon-si (KR)

(72) Inventors: Gi Moon Hong, Icheon-si (KR); Kyu Dong Hwang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/034,853

(22) Filed: Sep. 28, 2020

(30) Foreign Application Priority Data

May 29, 2020 (KR) ........................ 10-2020-0065009

(51) Int. Cl.
| | |
|---|---|
| *G06F 1/10* | (2006.01) |
| *H03K 5/26* | (2006.01) |
| *G06F 1/06* | (2006.01) |
| *H02M 3/07* | (2006.01) |
| *H03K 5/00* | (2006.01) |
| *H03K 21/02* | (2006.01) |

(52) U.S. Cl.
CPC .................. *G06F 1/10* (2013.01); *G06F 1/06* (2013.01); *H03K 5/26* (2013.01); *H02M 3/07* (2013.01); *H03K 21/02* (2013.01); *H03K 2005/00019* (2013.01)

(58) Field of Classification Search
CPC .... G06F 1/10; G06F 1/06; H03K 5/26; H03K 21/02; H03K 2005/00019; H02M 3/07
USPC .......................................................... 327/261
See application file for complete search history.

(56) References Cited

U.S. PATENT DOCUMENTS

| | | | | |
|---|---|---|---|---|
| 7,936,193 | B2 * | 5/2011 | Van Der Wel | ........ H03L 7/0812 327/156 |
| 2007/0273422 | A1 * | 11/2007 | Kuo | ...................... H03H 11/26 327/261 |
| 2010/0013533 | A1 * | 1/2010 | Lee | ....................... H03H 11/265 327/159 |
| 2013/0307616 | A1 * | 11/2013 | Berchtold | ............. H03F 1/0227 330/127 |

* cited by examiner

*Primary Examiner* — Tomi Skibinski
(74) *Attorney, Agent, or Firm* — William Park & Associates Ltd.

(57) ABSTRACT

A clock compensation circuit includes a delay circuit configured to generate a plurality of second clock signals by delaying a plurality of first clock signals, a voltage conversion circuit configured to convert phase differences between the plurality of second clock signals into voltages and output converted voltages as a plurality of phase difference voltages, and a comparison circuit configured to generate a plurality of phase difference detection signals by comparing the plurality of phase difference voltages with a reference voltage. The clock compensation circuit also includes a phase error control circuit configured to generate a plurality of control signals for controlling the delay circuit, the voltage conversion circuit, and the comparison circuit according to any of the plurality of second clock signals and the plurality of phase difference detection signals.

24 Claims, 15 Drawing Sheets ideal

VREF:level1 O<1:4>=0000
VREF:level2 O<1:4>=0000
VREF:level3 O<1:4>=1111
VREF:level4 O<1:4>=1111
    SUM1 = 2
    SUM2 = 2
    SUM3 = 2
    SUM4 = 2 phase error

VREF:level1 O<1:4>=0000
VREF:level2 O<1:4>=1000
VREF:level3 O<1:4>=1011
VREF:level4 O<1:4>=1111
    SUM1 = 3
    SUM2 = 1
    SUM3 = 2
    SUM4 = 2

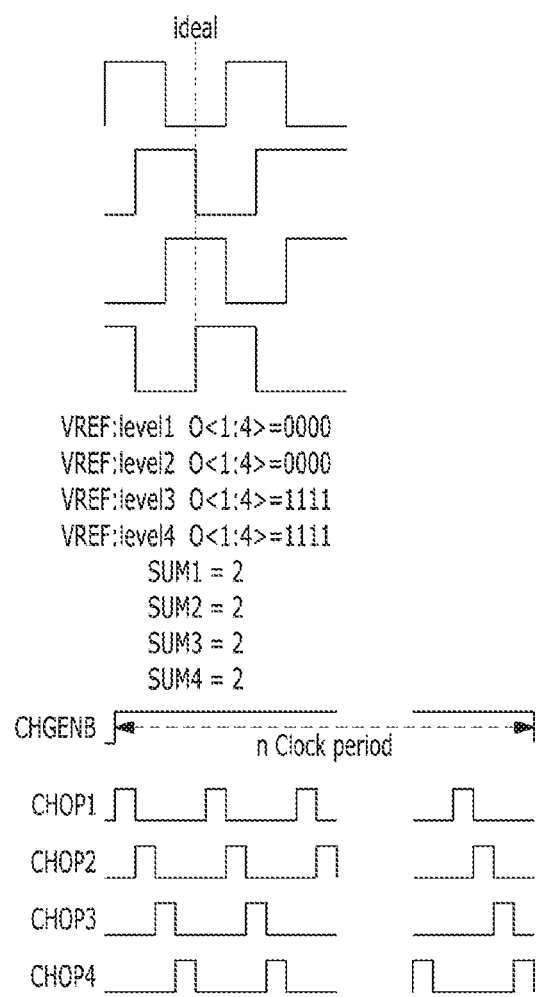

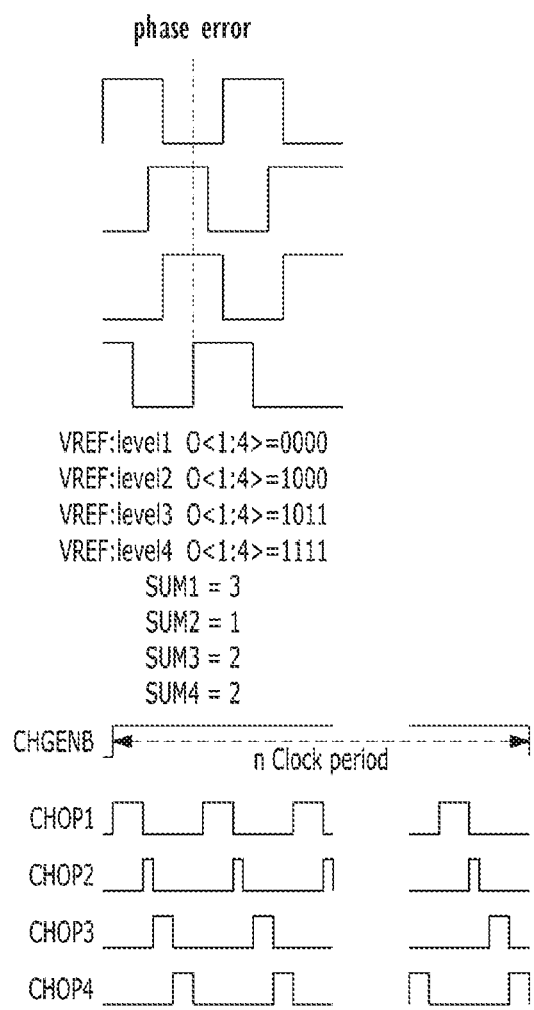

CLOCK COMPENSATION CIRCUIT

CROSS-REFERENCE TO RELATED APPLICATIONS

The present application claims priority under 35 U.S.C. § 119(a) to Korean application number 10-2020-0065009, filed on May 29, 2020, in the Korean Intellectual Property Office, which is incorporated herein by reference in its entirety.

BACKGROUND

1. Technical Field

Various embodiments may generally relate to a semiconductor circuit, and more particularly, to a clock compensation circuit.

2. Related Art

In recent years, with the technology development of memory systems, high-speed data processing is required, and thus a high data transmission rate is also required for semiconductor memory devices To satisfy a high data transmission rate or a data high-bandwidth for data serially input from external systems, prefetch schemes are applied within semiconductor memory devices.

Semiconductor memory devices parallelize data input from outside and serialize data to be output to the outside.

The prefetch is an operation which latches data serially input from outside and parallelizes the serially input data, and semiconductor memory devices have to use clock signals having different phases, for example, multi-phase clock signals for such an operation.

Memory systems as well as high-operation interface type of data processing systems use multi-phase clock signals.

As the frequency of a clock signal is increased, phase errors between multi-phase clock signals may be caused and therefore, performance such as the operation speed of semiconductor memory devices using the multi-phase clock signals in which errors occur may be degraded.

SUMMARY

Some embodiments of the present disclosure are directed to a clock compensation circuit capable of compensating a phase error.

In an embodiment of the present disclosure, a clock compensation circuit may include: a delay circuit configured to generate a plurality of second clock signals by delaying a plurality of first clock signals; a voltage conversion circuit configured to convert phase differences between the plurality of second clock signals into voltages and output converted voltages as a plurality of phase difference voltages; a comparison circuit configured to generate a plurality of phase difference detection signals by comparing the plurality of phase difference voltages with a reference voltage; and a phase error control circuit configured to generate a plurality of control signals for controlling the delay circuit, the voltage conversion circuit, and the comparison circuit according to any of the plurality of second clock signals and the plurality of phase difference detection signals.

In an embodiment of the present disclosure, a clock compensation circuit may include: a delay circuit configured to generate a plurality of second clock signals by delaying a plurality of first clock signals according to a delay control signal; a voltage conversion circuit configured to convert phase differences between the plurality of second clock signals into voltages according to a voltage conversion control signal and output converted voltages as a plurality of phase difference voltages; a comparison circuit configured to generate a plurality of phase difference detection signals by comparing the plurality of phase difference voltages with a reference voltage; and a phase error control circuit configured to monitor variations of the plurality of phase difference detection signals while adjusting a level of the reference voltage using a reference voltage selection signal and adjust a value of the delay control signal so that phase errors of the plurality of second clock signals are compensated according to a monitoring result.

In an embodiment of the present disclosure, a clock compensation circuit may include: a delay circuit configured to generate a plurality of second clock signals by delaying a plurality of first clock signals according to a delay control signal; a phase difference pulse generation circuit configured to output pulses corresponding to phase differences between the plurality of second clock signals as a plurality of phase difference pulses; a voltage conversion circuit configured to convert the plurality of phase difference pulses into voltages according to a voltage conversion control signal and output converted voltages as a plurality of phase difference voltages; a comparison circuit configured to generate a plurality of phase difference detection signals by comparing the plurality of phase difference voltages with a reference voltage; and a phase error control circuit configured to monitor variations of the plurality of phase difference detection signals while adjusting a level of the reference voltage using a reference voltage selection signal and adjust a value of the delay control signal so that phase errors of the plurality of second clock signals are compensated according to a monitoring result.

These and other features, aspects, and embodiments are described in more detail below.

BRIEF DESCRIPTION OF THE DRAWINGS

The above and other aspects, features, and advantages of the subject matter of the present disclosure will be more clearly understood from the following detailed description taken in conjunction with the accompanying drawings, in which:

FIGS. 15 and 16 are diagrams for describing a phase error compensation method of a clock compensation circuit according to another embodiment of the present disclosure.

DETAILED DESCRIPTION

Various embodiments of the present teachings are described in detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments of the present teachings. However, embodiments of the present teachings should not be construed as limiting the present teachings. Although a few embodiments of the present teachings are shown and described, it will be appreciated by those of ordinary skill in the art that changes may be made in these embodiments without departing from the principles and spirit of the present teachings.

Hereinafter, embodiments of the present disclosure are only configuration examples of a clock compensation circuit which compensates phase differences of four-phase clock signals as multi-phase clock signals, but the configuration of the clock compensation circuit is not limited thereto and may be changed according to the number of multi-phase clock signals, circuit design schemes, and the like.

Figure 1:
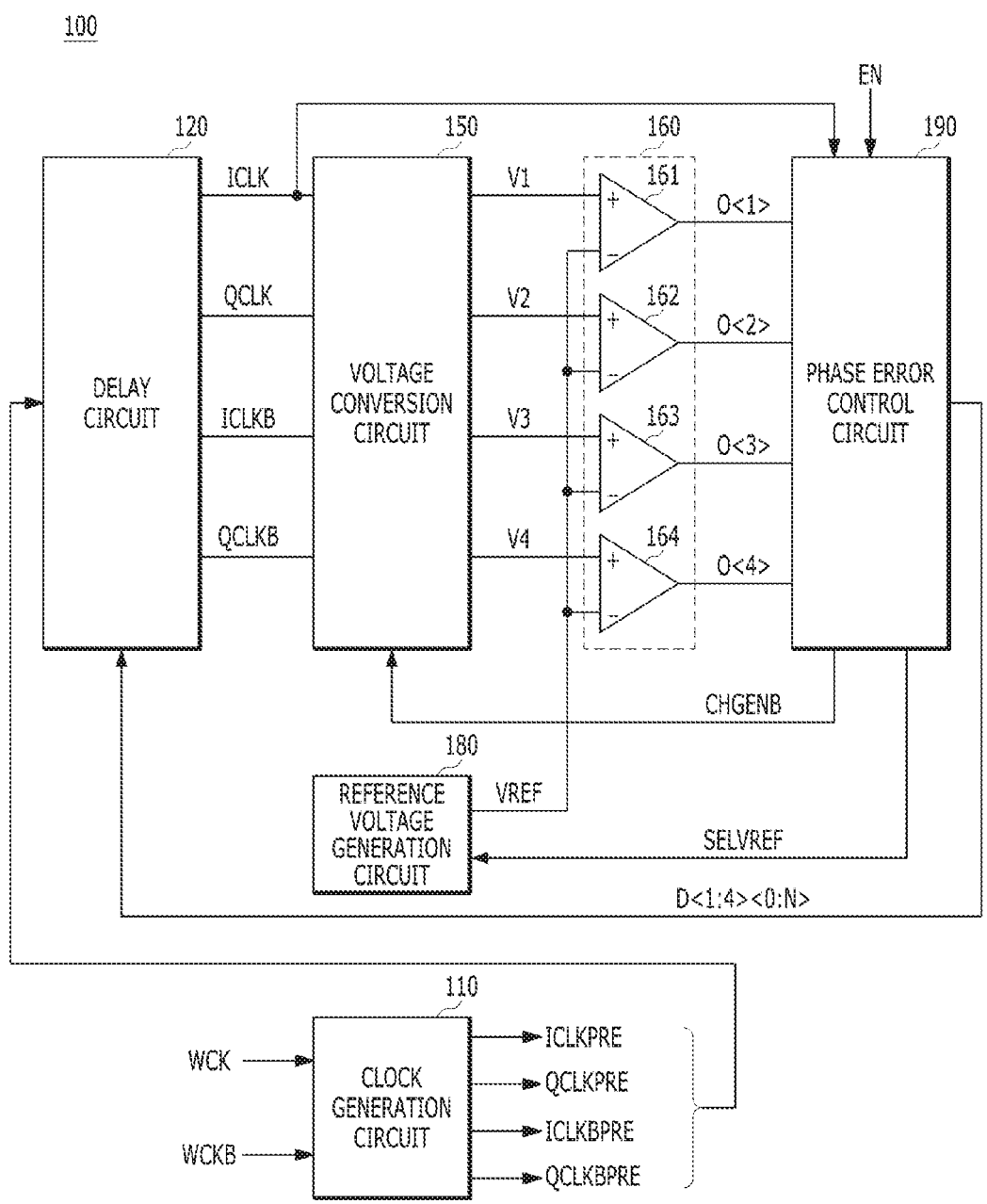
FIG. 1 is a diagram illustrating a configuration of a clock compensation circuit according to an embodiment of the present disclosure.

FIG. 1 is a diagram illustrating a configuration of a clock compensation circuit according to an embodiment.

Referring to FIG. 1, a clock compensation circuit 100 may include a delay circuit 120, a voltage conversion circuit 150, a comparison circuit 160, a reference voltage generation circuit 180, and a phase error control circuit 190.

The delay circuit 120 may generate a plurality of second clock signals ICLK, QCLK, ICLKB, and QCLKB by delaying a plurality of first clock signals ICLKPRE, QCLKPRE, ICLKBPRE, and QCLKBPRE by a first delay time adjusted according to delay control signals D<1:4><0:N>.

The voltage conversion circuit 150 may convert phase differences between the plurality of second clock signals ICLK, QCLK, ICLKB, and QCLKB into voltages according to a voltage conversion control signal CHGENB and output the converted voltages as first to fourth phase difference voltages V1, V2, V3, and V4.

The comparison circuit 160 may generate first to fourth phase difference detection signals O<1:4> by comparing the first to fourth phase difference voltages V1 to V4 with a reference voltage VREF.

The comparison circuit 160 may include first to fourth comparators 161 to 164.

The first comparator 161 may generate a first phase difference detection signal O<1> by comparing the first phase difference voltage V1 with the reference voltage VREF.

The second comparator 162 may generate a second phase difference detection signal O<2> by comparing the second phase difference voltage V2 with the reference voltage VREF.

The third comparator 163 may generate a third phase difference detection signal O<3> by comparing the third phase difference voltage V3 with the reference voltage VREF.

The fourth comparator 164 may generate a fourth phase difference detection signal O<4> by comparing the fourth phase difference voltage V4 with the reference voltage VREF.

The reference voltage generation circuit 180 may generate a plurality of voltage levels, select any one of the plurality of voltage levels according to a reference voltage selection signal SELVREF, and output the selected voltage level as the reference voltage VREF.

The phase error control circuit 190 may generate a plurality of control signals according to any one of the plurality of second clock signals ICLK, QCLK, ICLKB, and QCLKB, for example, the second clock signal ICLK and the first to fourth phase difference detection signals O<1:4>.

The plurality of control signals may include the reference voltage selection signal SELVREF, the voltage conversion control signal CHGENB, and the delay control signals D<1:4><0:N>.

The phase error control circuit 190 may be activated according to an enable signal EN to perform an operation of generating the plurality of control signals.

The enable signal EN may be provided from an external apparatus, for example, a semiconductor device including the clock compensation circuit 100, a memory controller configured to control the semiconductor device, and the like.

The external apparatus may optionally activate the enable signal EN according to various operation conditions including power-up of the semiconductor device, a mode register input of the semiconductor device, a specific command (for example, self-refresh exit command), and the like.

The phase error control circuit 190 may monitor phase errors between the plurality of second clock signals ICLK, QCLK, ICLKB, and QCLKB while adjusting the level of the reference voltage VREF and adjust delay times of the plurality of second clock signals ICLK, QCLK, ICLKB, and QCLKB so that the phase errors are compensated according to a monitoring result.

The phase error control circuit 190 may monitor variations of the first to fourth phase difference detection signals O<1:4> while adjusting the level of the reference voltage VREF using the reference voltage selection signal SELVREF and adjust values of the delay control signals D<1:4><0:N> so that the phase errors of the plurality of second clock signals ICLK, QCLK, ICLKB, and QCLKB are compensated according to the monitoring result.

Referring to FIG. 1, the clock compensation circuit 100 may further include a clock generation circuit 110.

The clock generation circuit 110 may generate the plurality of first clock signals ICLKPRE, QCLKPRE, ICLKBPRE, and QCLKBPRE using external clock signals WCK and WCKB.

The external clock signals WCK and WCKB may be provided from an external apparatus, for example, a semiconductor device including the clock compensation circuit 100, a memory controller configured to control the semiconductor device, and the like.

Figure 2:
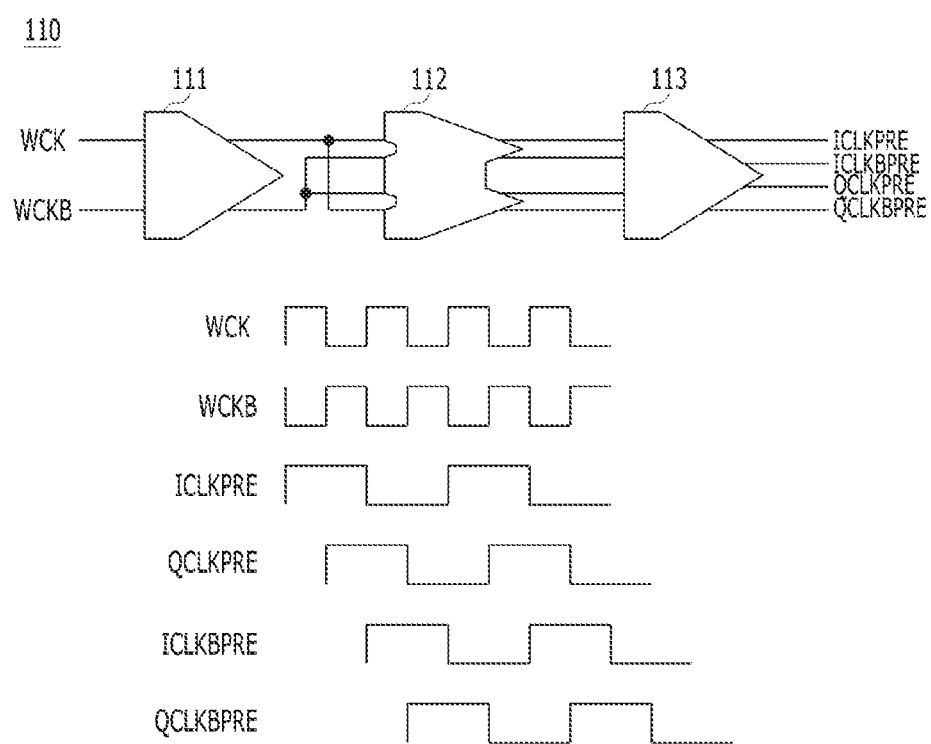
FIG. 2 is a diagram illustrating a configuration of a clock generation circuit of FIG. 1.

FIG. 2 is a diagram illustrating a configuration of the clock generation circuit 110 of FIG. 1.

Referring to FIG. 2, the clock generation circuit 110 may include a first buffer 111, a divider 112, and a second buffer 113.

The first buffer 111 may buffer the differential external clock signals WCK and WCKB and output buffered results.

The divider 112 may generate multi-phase signals by receiving outputs of the first buffer 111.

The second buffer 113 may buffer outputs of the divider 112 and output buffered results as the plurality of first clock signals ICLKPRE, QCLKPRE, ICLKBPRE, and QCLKBPRE.

Figure 3:
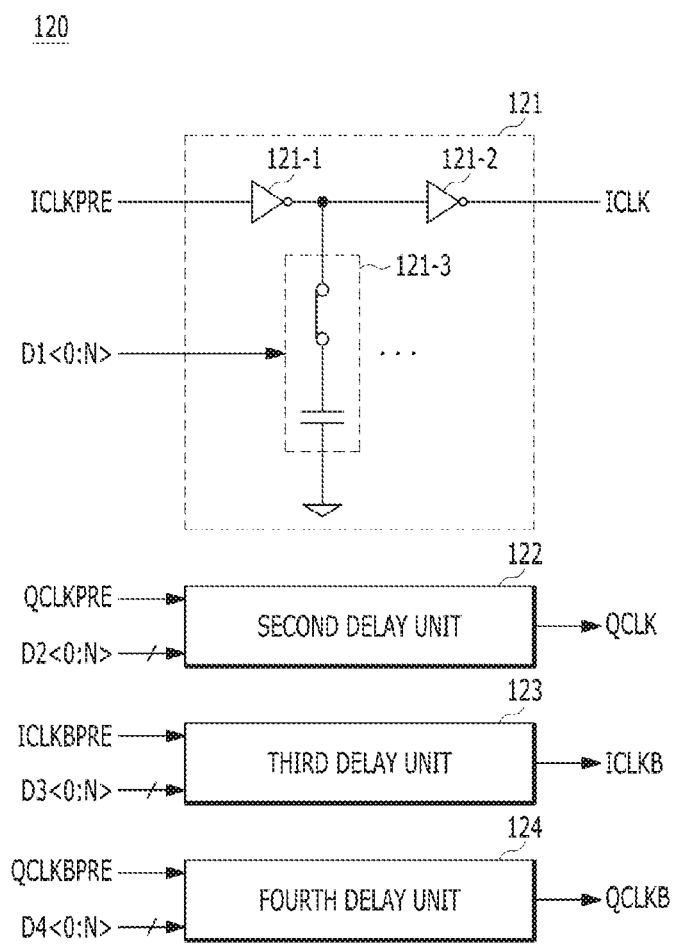
FIG. 3 is a diagram illustrating a configuration of a delay circuit of FIG. 1.

FIG. 3 is a diagram illustrating a configuration of the delay circuit 120 of FIG. 1.

Referring to FIG. 3, the delay circuit 120 may generate the plurality of second clock signals ICLK, QCLK, ICLKB, and QCLKB by independently delaying the plurality of first clock signals ICLKPRE, QCLKPRE, ICLKBPRE, and QCLKBPRE according to the first to fourth delay control signals D<1:N><0:N>.

The delay circuit 120 may include first to fourth delay units 121 to 124.

The first delay unit 121 may output one of the plurality of second clock signals ICLK, QCLK, ICLKB, and QCLKB, for example, the second clock signal ICLK by delaying one of the plurality of first clock signals ICLKPRE, QCLKPRE, ICLKBPRE, and QCLKBPRE, for example, the first clock signal ICLKPRE by a delay time varied according to the first delay control signal D1<0:N>.

The first delay unit 121 may include first and second inverters 121-1 and 121-2 and a plurality of variable capacitors 121-3.

The first inverter 121-1 may invert the first clock signal ICLKPRE and output an inverting result.

The second inverter 121-2 may invert an output of the first inverter 121-1 and output an inverting result as the second clock signal ICLK.

The plurality of variable capacitors 121-3 may be coupled in parallel between an output node of the first inverter 121-1 and a ground terminal.

The plurality of variable capacitors 121-3 may delay a voltage level variation of the output node of the first inverter 121-1 by a time corresponding to a capacitance varied according to the first delay control signal D1<0:N>.

Each of the plurality of variable capacitors 121-3 may include a switch coupled to the output node of the first inverter 121-1 and a capacitor coupled between the switch and the ground terminal.

The switches included in the plurality of variable capacitors 121-3 may be controlled according to bits of the first delay control signal D1<0:N>.

The second delay unit 122 may output one of the plurality of second clock signals ICLK, QCLK, ICLKB, and QCLKB, for example, the second clock signal QCLK by delaying one of the plurality of first clock signals ICLKPRE, QCLKPRE, ICLKBPRE, and QCLKBPRE, for example, the first clock signal QCLKPRE by a delay time varied according to the second delay control signal D2<0:N>.

The third delay unit 123 may output one of the plurality of second clock signals ICLK, QCLK, ICLKB, and QCLKB, for example, the second clock signal ICLKB by delaying one of the plurality of first clock signals ICLKPRE, QCLKPRE, ICLKBPRE, and QCLKBPRE, for example, the first clock signal ICLKBPRE by a delay time varied according to the third delay control signal D3<0:N>.

The fourth delay unit 124 may output one of the plurality of second clock signals ICLK, QCLK, ICLKB, and QCLKB, for example, the second clock signal QCLKB by delaying one of the plurality of first clock signals ICLKPRE, QCLKPRE, ICLKBPRE, and QCLKBPRE, for example, the first clock signal QCLKBPRE by a delay time varied according to the fourth delay control signal D4<0:N>.

The second to fourth delay units 122 to 124 may have the same configurations as the first delay unit 121.

The configuration of the delay circuit 120 in FIG. 3 is merely exemplary, and the number of delay units constituting the delay circuit 120 and the circuit configuration of each delay may be changed according to the number of clocks, circuit design schemes, and the like.

The first to fourth delay unit control signals D<1:4><0:N> may be used the delay control signals D<1:4><0:N>.

Figure 4:
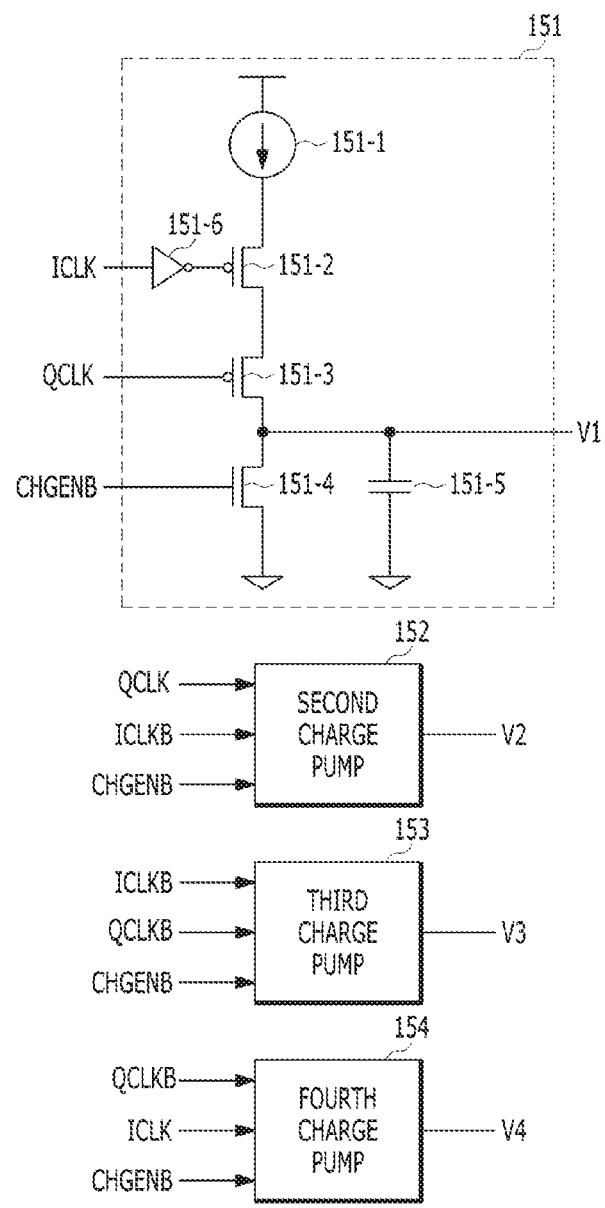
FIG. 4 is a diagram illustrating a configuration of a voltage conversion circuit of FIG. 1.

FIG. 4 is a diagram illustrating a configuration of the voltage conversion circuit 150 of FIG. 1.

Referring to FIG. 4, the voltage conversion circuit 150 may include first to fourth charge pumps 151 to 154.

The first charge pump 151 may perform a charge pumping operation according to a phase difference of two second clock signals (for example, ICLK and QCLK) of the plurality of second clock signals ICLK, QCLK, ICLKB, and QCLKB and the voltage conversion control signal CHGENB and outputs a voltage level charged through the charge pumping operation as the first phase difference voltage V1.

The first charge pump 151 may include a current source 151-1, first to third transistors 151-2 to 151-4, a capacitor 151-5, and inverter 151-6.

The inverter 151-6 may invert the second clock signal ICLK and output an inverting result.

A source of the first transistor 151-2 may be coupled to the current source 151-1 and a gate of the first transistor 151-2 may receive an output of the inverter 151-6.

A source of the second transistor 151-3 may be coupled to a drain of the first transistor 151-2 and a gate of the second transistor 151-3 may receive the second clock signal QCLK.

A drain of the third transistor 151-4 may be coupled to a drain of the second transistor 151-3, a gate of the third transistor 151-4 may receive the voltage conversion control signal CHGENB, and a source of the third transistor 151-4 may be coupled to the ground terminal.

The capacitor 151-5 may be coupled to a node to which the second transistor 151-3 and the third transistor 151-4 are coupled and the ground terminal.

A voltage charged in the capacitor 151-5 may be output as the first phase difference voltage V1.

The second charge pump 152 may perform a charge pumping operation according to a phase difference of two second clock signals (for example, QCLK and ICLKB) of the plurality of second clock signals ICLK, QCLK, ICLKB, and QCLKB and the voltage conversion control signal CHGENB and outputs a voltage level charged through the charge pumping operation as the second phase difference voltage V2.

The third charge pump 153 may perform a charge pumping operation according to a phase difference of two second clock signals (for example, ICLKB and QCLKB) of the plurality of second clock signals ICLK, QCLK, ICLKB, and QCLKB and the voltage conversion control signal CHGENB and outputs a voltage level charged through the charge pumping operation as the third phase difference voltage V3.

The fourth charge pump 154 may perform a charge pumping operation according to a phase difference of two second clock signals (for example, QCLKB and ICLK) of the plurality of second clock signals ICLK, QCLK, ICLKB, and QCLKB and the voltage conversion control signal CHGENB and outputs a voltage level charged through the charge pumping operation as the fourth phase difference voltage V4.

The second to fourth charge pumps 152 to 154 may have the same configurations as the first charge pump 151.

Figure 5:
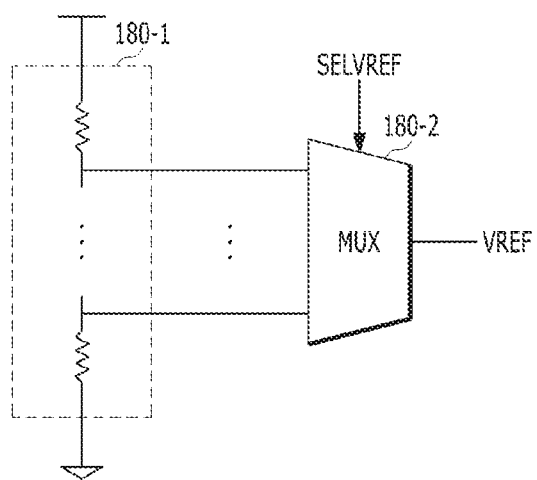
FIG. 5 is a diagram illustrating a configuration of a reference voltage generation circuit of FIG. 1.

FIG. 5 is a diagram illustrating a configuration of the reference voltage generation circuit 180 of FIG. 1.

Referring to FIG. 5, the reference voltage generation circuit 180 may include a voltage divider 180-1 and a multiplexer 180-2.

The voltage divider 180-1 may divide a voltage level of the power supply terminal to generate a plurality of voltage levels.

The voltage divider 180-1 may include a plurality of resistors coupled between the power supply terminal and the ground terminal.

The plurality of voltage levels may be generated through nodes to which the plurality of resistors are coupled.

The multiplexer 180-2 may select one of the plurality of voltage levels generated in the voltage divider 180-1 according to the reference voltage selection signal SELVREF and output the selected voltage level as the reference voltage VREF.

Figure 6:
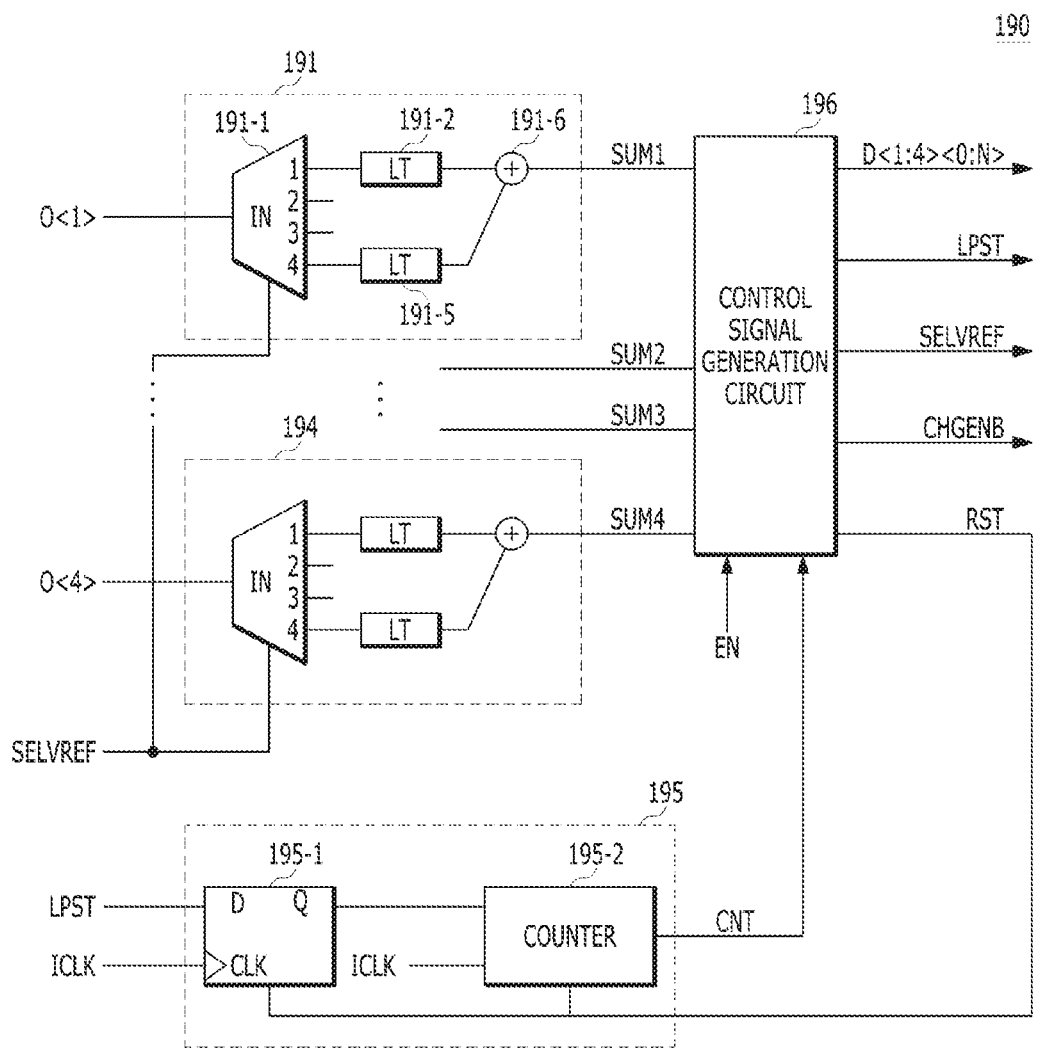
FIG. 6 is a diagram illustrating a configuration of a phase error control circuit of FIG. 1.

FIG. 6 is a diagram illustrating a configuration of the phase error control circuit 190 of FIG. 1.

Referring to FIG. 6, the phase error control circuit 190 may include first to fourth summers 191 to 194, a counting circuit 195, and a control signal generation circuit 196.

The first summer 191 may sequentially store values of the first phase difference detection signal O<1>, which are detected according to the reference voltages VREF having different levels, in response to the reference voltage selection signal SELVREF and generate a first sum signal SUM1 by adding the stored values.

The first summer 191 may include a demultiplexer 191-1, first to fourth latches 191-2 to 191-5, and an adder 191-6.

The demultiplexer 191-1 may store the first phase difference detection signal O<1> in a selected latch of the first to fourth latches 191-2 to 191-5 in response to the reference voltage selection signal SELVREF.

The adder 191-6 may generate the first sum signal SUM1 by adding the values stored in the first to fourth latches 191-2 to 191-5.

The second summer 192 may sequentially store values of the second phase difference detection signal O<2>, which are detected according to the reference voltages VREF having different levels, in response to the reference voltage selection signal SELVREF and generate a second sum signal SUM2 by adding the stored values.

The third summer 193 may sequentially store values of the third phase difference detection signal O<3>, which are detected according to the reference voltages VREF having different levels, in response to the reference voltage selection signal SELVREF and generate a third sum signal SUM3 by adding the stored values.

The fourth summer 194 may sequentially store values of the fourth phase difference detection signal O<4>, which are detected according to the reference voltages VREF having different levels, in response to the reference voltage selection signal SELVREF and generate a fourth sum signal SUM4 by adding the stored values. The second to fourth summers 192 to 194 may have the same configurations as the first summer 191.

The counting circuit 195 may generate a counting signal CNT by counting one of the plurality of second clock signals ICLK, QCLK, ICLKB, and QCLKB, for example, the second clock signal ICLK, in response to a loop start signal LPST.

The counting circuit 195 may include a flip flop 195-1 and a counter 195-2.

The flip flop 195-1 may latch and output the loop start signal LPST in response to the second clock signal ICLK.

The counter 195-2 may count the second clock signal ICLK in response to the loop start signal LPST and output a counting result as the counting signal CNT.

Outputs of the flip flop 195-1 and the counter 195-2 may be reset according to a reset signal RST.

The control signal generation circuit 196 may generate the delay control signals D<1:4><0:N>, the loop start signal LPST, the reference voltage selection signal SELVREF, the voltage conversion control signal CHGENB, and the reset signal RST in response to the enable signal EN, the counting signal CNT, and the first to fourth sum signals SUM1 to SUM4.

Figure 7:
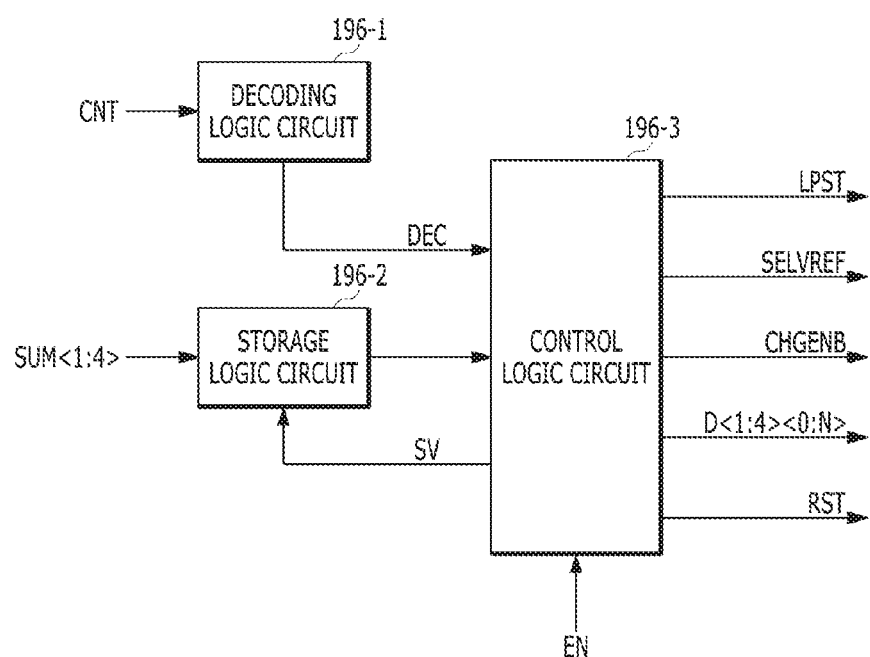
FIG. 7 is a diagram illustrating a configuration of a control signal generation circuit of FIG. 6.

FIG. 7 is a diagram illustrating a configuration of the control signal generation circuit 196 of FIG. 6.

Referring to FIG. 7, the control signal generation circuit 196 may include a decoding logic circuit 196-1, a storage logic circuit 196-2, and a control logic circuit 196-3.

The decoding logic circuit 196-1 may generate a decoding signal DEC by decoding the counting signal CNT.

The decoding signal DEC may include information for various operation timings.

The storage logic circuit 196-2 may store the first to fourth sum signals SUM1 to SUM4 according to a storage control signal SV.

The storage logic circuit 196-2 may include a plurality of registers configured to store the first to fourth sum signals SUM1 to SUM4.

The control logic circuit 196-3 may generate the loop start signal LPST by determining whether or not a phase error is compensable according to the enable signal EN.

The control logic circuit 196-3 may determine whether or not the phase error is compensable according to the values of the delay control signals D<1:4><0:N>.

For example, when the values of the delay control signals D<1:4><0:N> are not maximum at a timing when the enable signal EN is activated, the phase error may be compensable, and thus the loop start signal LPST may be activated.

When the values of the delay control signals D<1:4><0:N> are maximum at the timing when the enable signal EN is activated, the phase error cannot be adjustable anymore and the loop start signal LPST may be maintained in inactivated state.

The control logic circuit 196-3 may generate the loop start signal LPST without determining whether the phase error is compensable. For example, the control logic circuit 196-3 may convert the phase error into a compensable state by initializing the delay control signals D<1:4><0:N> according to the enable signal EN and activate the loop start signal LPST.

The decoding signal DEC may include information for various operation timings. Accordingly, the control logic circuit 196-3 may recognize the various operation timings according to the decoding signal DEC and generate the reference voltage selection signal SELVREF, the voltage conversion control signal CHGENB, the storage control signal SV, and the reset signal RST to match the various operation timings.

The various operation timings may include a reference voltage level adjustment timing, a voltage conversion timing, a storage timing of the first to fourth sum signals SUM1 to SUM4, and a reset timing of the counting signal CNT.

The control logic circuit 196-3 may adjust the values of the delay control signals D<1:4><0:N> according to the first to fourth sum signals SUM1 to SUM4 stored in the storage logic circuit 196-2.

The control logic circuit 196-3 may detect a minimum value of the values of the first to fourth sum signals SUM1 to SUM4 by comparing the values of the first to fourth sum signals SUM1 to SUM4 with each other and generate the delay control signals D<1:4><0:N> for independently adjusting phases of the plurality of second clock signals ICLK, QCLK, ICLKB, and QCLKB by times corresponding to values that subtract the minimum value from the values of the first to fourth sum signals SUM1 to SUM4.

When the detected minimum value is equal to or smaller than an internal reference value, the control logic circuit 196-3 may fix the values of the delay control signals D<1:4><0:N> to current values so that the phase adjustment for the plurality of second clock signals ICLK, QCLK, ICLKB, and QCLKB is not performed.

For example, in a case where the initial reference value is set to '1', the control logic circuit 196-3 may perform phase adjustment on the plurality of second clock signals ICLK, QCLK, ICLKB, and QCLKB by adjusting the values of the delay control signals D<1:4><0:N> when the detected minimum value is larger than '1', and the control logic circuit 196-3 might not perform phase adjustment on the plurality of second clock signals ICLK, QCLK, ICLKB, and QCLKB by fixing the values of the delay control signals D<1:4><0:N> to the current values when the detected minimum value is equal to or smaller than '1'.

In a case where the initial reference value is set to '0', the control logic circuit 196-3 may perform phase adjustment on the plurality of second clock signals ICLK, QCLK, ICLKB, and QCLKB by adjusting the values of the delay control signals D<1:4><0:N> when the detected minimum value is larger than '1'.

The initial reference value may be adjusted by a test mode, a mode register set (MRS), and the like.

Figure 8:
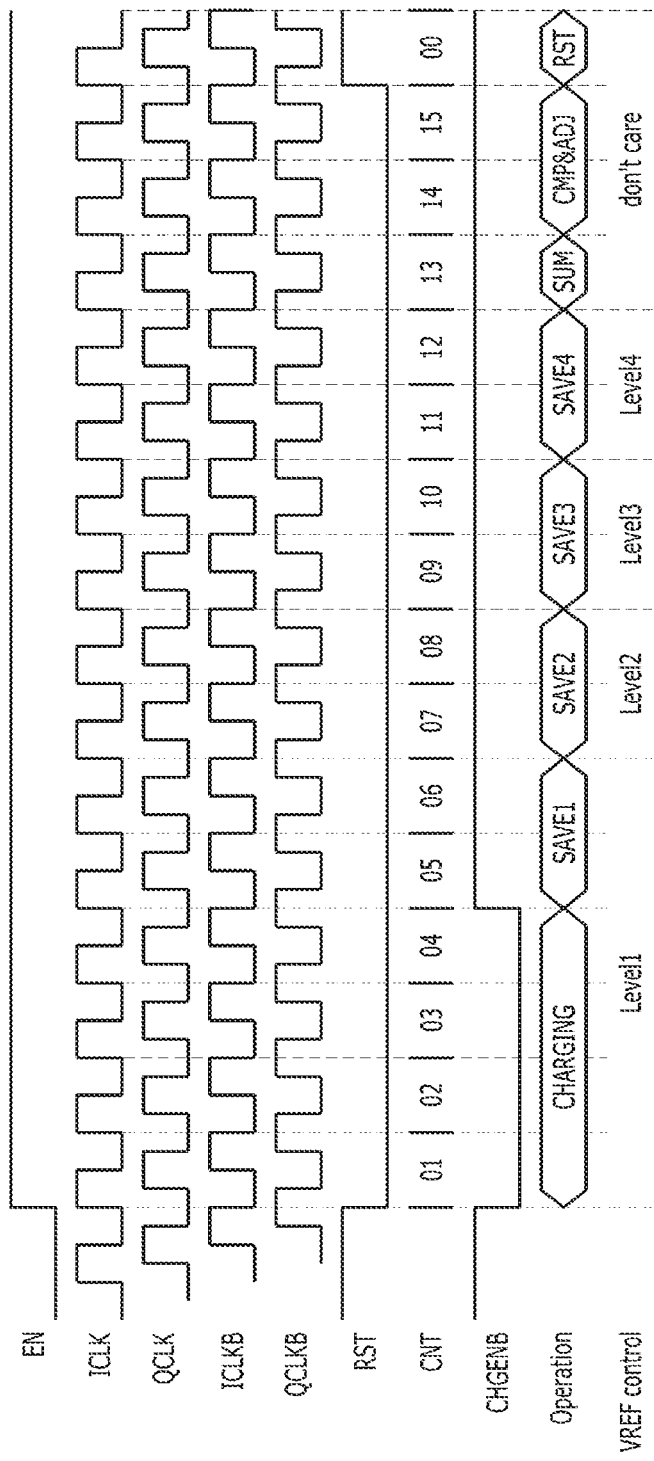
FIG. 8 is a timing diagram illustrating an example of an operation method of a clock compensation circuit according to an embodiment of the present disclosure.
Figure 9:
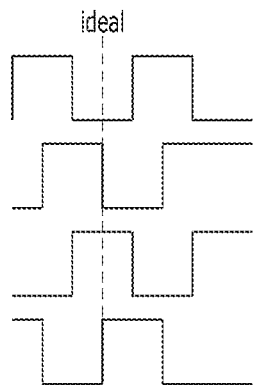
FIGS. 9 and 10 are diagrams for describing a phase error compensation method of a clock compensation circuit according to an embodiment of the present disclosure.
Figure 10:
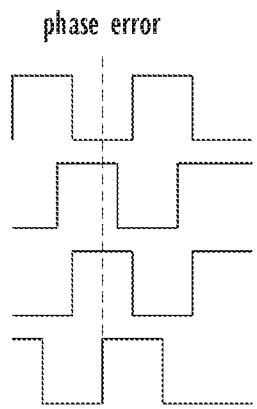

FIG. 8 is a timing diagram illustrating an example of an operation method of a clock compensation circuit according to an embodiment and FIGS. 9 and 10 are diagrams for describing a phase error compensation method of a clock compensation circuit according to an embodiment.

An example of the operation method of a clock compensation circuit according to an embodiment will be described with reference to FIG. 8 below.

Referring to FIG. 8, the enable signal EN is activated to a high level, and when a phase error is compensable, the loop start signal LPST may be activated to a high level.

As the loop start signal LPST is activated, the second clock signal ICLK may be counted and a value of the counting signal CNT may be sequentially increased.

During a duration determined by the counting signal CNT, for example, during a duration when the value of the counting signal CNT is 1 to 4, the voltage conversion control signal CHGENB may be activated to a low level.

During the activation duration of the voltage conversion control signal CHGENB, a charging operation CHARGING, which generates the first to fourth phase difference voltages V1 to V4 by charging the voltages corresponding to the phase differences between the plurality of second clock signals ICLK, QCLK, ICLKB, and QCLKB, may be performed.

A first storage operation SAVE1, which generates the first to fourth phase difference detection signals O<1:4> by comparing the first to fourth phase difference voltages V1 to V4 with the reference voltage VREF determined to a first level and stores the generated first to fourth phase difference detection signals O<1:4>, may be performed during a determined duration, for example, a duration when the value of the counting signal CNT is 5 to 6.

A second storage operation SAVE2, which adjusts the level of the reference voltage VREF to a second level, generates the first to fourth phase difference detection signals O<1:4> by comparing the first to fourth phase difference voltages V1 to V4 with the reference voltage VREF adjusted to the second level, and stores the generated first to fourth phase difference detection signals O<1:4>, may be performed during a determined duration, for example, a duration when the value of the counting signal CNT is 7 to 8.

A third storage operation SAVE3, which adjusts the level of the reference voltage VREF to a third level, generates the first to fourth phase difference detection signals O<1:4> by comparing the first to fourth phase difference voltages V1 to V4 with the reference voltage VREF adjusted to the third level, and stores the generated first to fourth phase difference detection signals O<1:4>, may be performed during a determined duration, for example, a duration when the value of the counting signal CNT is 9 to 10.

A fourth storage operation SAVE4, which adjusts the level of the reference voltage VREF to a fourth level, generates the first to fourth phase difference detection signals O<1:4> by comparing the first to fourth phase difference voltages V1 to V4 with the reference voltage VREF adjusted to the fourth level, and stores the generated first to fourth phase difference detection signals O<1:4>, may be performed during a determined duration, for example, a duration when the value of the counting signal CNT is 11 to 12.

A summing operation SUM, which generates the first to fourth sum signals SUM1 to SUM4 by adding the values of the first to fourth phase difference detection signals O<1:4> stored through the first to fourth storage operations SAVE1 to SAVE4, may be performed during a determined duration, for example, a duration when the value of the counting signal CNT is 13.

A comparing and adjusting operation CMP&ADJ, which performs phase adjustment by comparing the values of the first to fourth sum signals SUM1 to SUM4 with each other, may be performed during a determined duration, for example, a duration when the value of the counting signal CNT is 14 to 15.

The value of the counting signal CNT may be initialized by the reset signal RST after the comparing and adjusting operation CMP&ADJ operation is performed.

The series of operation processes may be repeatedly performed until the phase differences between the plurality of second clock signals ICLK, QCLK, ICLKB, and QCLKB become within a target value.

A phase error compensation method of a clock compensation circuit according to an embodiment will be described with reference to FIGS. 9 and 10 below.

First, an operation of the clock compensation circuit in an ideal case where the phase differences between the plurality of second clock signals ICLK, QCLK, ICLKB, and QCLKB match a target value will be described with reference to FIG. 9.

Referring to FIG. 9, the values of the first to fourth phase difference detection signals O<1:4> detected in a case where the reference voltage VREF has the first level may be '0000'. The values of the first to fourth phase difference detection signals O<1:4> detected in a case where the reference voltage VREF has the second level may be '0000'. The values of the first to fourth phase difference detection signals O<1:4> detected in a case where the reference voltage VREF has the third level may be '1111'. The values of the first to fourth phase difference detection signals O<1:4> detected in a case where the reference voltage VREF has the fourth level may be '1111'.

All of a value of the first sum signal SUM1 for which the values of the first phase difference detection signal O<1> for the levels of the reference voltage VREF are added, a value of the second sum signal SUM2 for which the values of the second phase difference detection signal O<2> for the levels of the reference voltage VREF are added, a value of the third sum signal SUM3 for which the values of the third phase difference detection signal O<3> for the levels of the reference voltage VREF are added, and a value of the fourth sum signal SUM4 for which the values of the fourth phase difference detection signal O<4> for the levels of the reference voltage VREF are added are equally '2'.

Because the minimum value of the values of the first to fourth sum signals SUM1 to SUM4 is '2', the values with '2' subtracted from the values of the first to fourth sum signals SUM1 to SUM4 become '0'.

The meaning that the values which subtract '2' as the minimum value from the values of the first to fourth sum signals SUM1 to SUM4 are '0' may represent that the phase adjustment is unnecessary.

Accordingly, the control logic circuit 196-3 in FIG. 7 might not perform the phase adjustment operation ADJ on the plurality of second clock signals ICLK, QCLK, ICLKB, and QCLKB.

Next, an operation of a clock compensation circuit in a case where the phase differences between the plurality of second clock signals ICLK, QCLK, ICLKB, and QCLKB are deviated from the target value and the phase errors exist will be described with reference to FIG. 10.

Referring to FIG. 10, the values of the first to fourth phase difference detection signals O<1:4> detected in a case where the reference voltage VREF has the first level may be '0000'. The values of the first to fourth phase difference detection signals O<1:4> detected in a case where the reference voltage VREF has the second level may be '1000'. The values of the first to fourth phase difference detection signals O<1:4> detected in a case where the reference voltage VREF has the third level may be '1011'. The values of the first to fourth phase difference detection signals O<1:4> detected in a case where the reference voltage VREF has the fourth level may be '1111'.

A value of the first sum signal SUM1 for which the values of the first phase difference detection signal O<1> for the levels of the reference voltage VREF are added is '3', a value of the second sum signal SUM2 for which the values of the second phase difference detection signal O<2> for the levels of the reference voltage VREF are added is '1', a value of the third sum signal SUM3 for which the values of the third phase difference detection signal O<3> for the levels of the reference voltage VREF are added is '2', and a value of the fourth sum signal SUM4 for which the values of the fourth phase difference detection signal O<4> for the levels of the reference voltage VREF are added is '2'.

Because the minimum value of the values of the first to fourth sum signals SUM1 to SUM4 is '1', the values with '1' subtracted from the values of the first to fourth sum signals SUM1 to SUM4 are '2, 0, 1, 1'.

The control logic circuit 196-3 in FIG. 7 may adjust the values of the delay control signals D<1:4><0:N> so that the phase adjustment is performed by '2, 0, 1, 1' with respect to the plurality of second clock signals ICLK, QCLK, ICLKB, and QCLKB.

Figure 11:
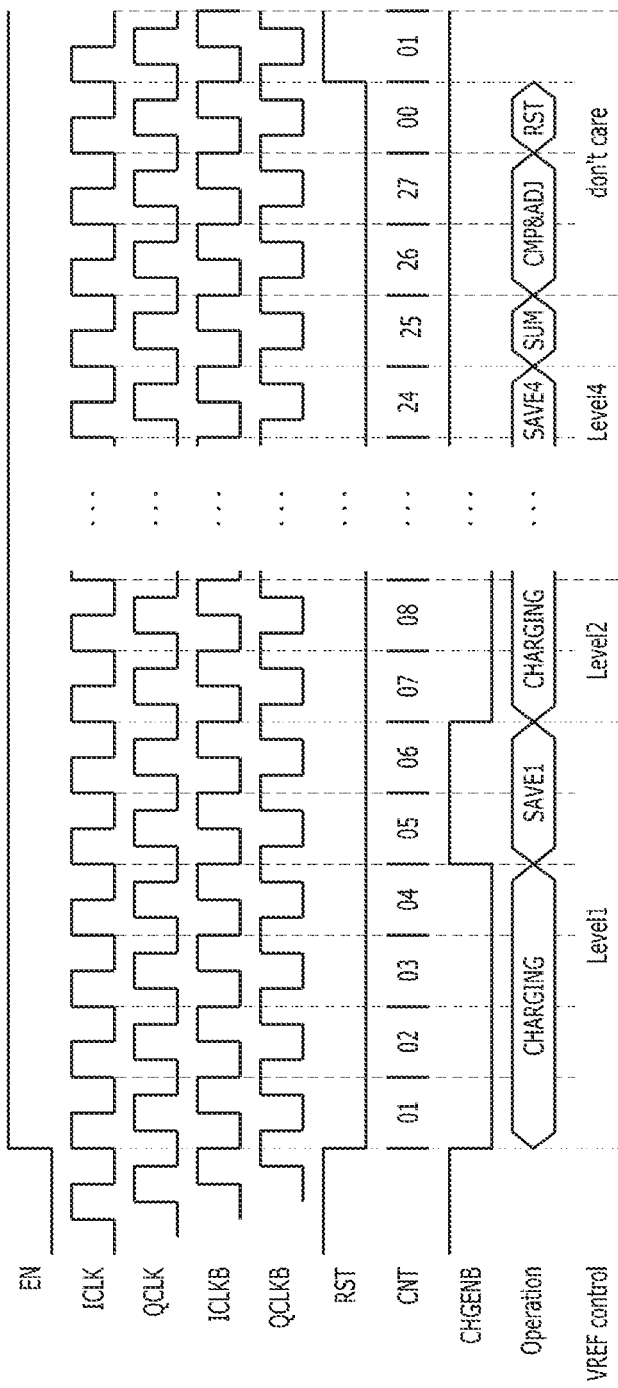
FIG. 11 is a timing diagram illustrating another example of an operation method of a clock compensation circuit according to an embodiment of the present disclosure.

FIG. 11 is a timing diagram illustrating another example of an operation method of a clock compensation circuit according to an embodiment.

Referring to FIG. 11, the enable signal EN is activated to a high level and when a phase error is compensable, the loop start signal LPST may be activated to a high level.

As the loop start signal LPST is activated, the second clock signal ICLK may be counted and a value of the counting signal CNT may be sequentially increased.

During a duration determined by the counting signal CNT, for example, during a duration when the value of the counting signal CNT is 1 to 4, the voltage conversion control signal CHGENB may be activated to a low level.

During the activation duration of the voltage conversion control signal CHGENB, a charging operation CHARGING, which generates the first to fourth phase difference voltages V1 to V4 by charging the voltages corresponding to the phase differences between the plurality of second clock signals ICLK, QCLK, ICLKB, and QCLKB, may be performed.

After the charging operation CHARGING is completed, the voltage conversion control signal CHGENB may be inactivated to a high level at a timing when the value of the counting signal CNT becomes 5.

A first storage operation SAVE1, which generates the first to fourth phase difference detection signals O<1:4> by comparing the first to fourth phase difference voltages V1 to V4 with the reference voltage VREF determined to a first level and stores the generated first to fourth phase difference detection signals O<1:4>, may be performed during a determined duration, for example, a duration when the value of the counting signal CNT is 5 to 6.

After the first storage operation SAVE1 is completed, the level of the reference voltage VREF may be adjusted to the second level at a timing when the value of the counting signal CNT becomes '7', and the voltage conversion control signal CHGENB may be activated to the low level again during a determined duration, for example, a duration when the value of the counting signal CNT is 7 to 10.

The charging operation CHARGING may be performed again during a duration when the voltage conversion control signal CHGENB is activated.

A second storage operation SAVE2, which generates the first to fourth phase difference detection signals O<1:4> by comparing the first to fourth phase difference voltages V1 to V4 with the reference voltage VREF determined to the second level, and stores the generated first to fourth phase difference detection signals O<1:4>, may be performed during a determined duration, for example, a duration when the value of the counting signal CNT is 13 to 16.

The charging operation CHARGING, a third storage operation SAVE3, the charging operation CHARGING, and a fourth storage operation SAVE4 may be performed by repeating the above-described method.

A summing operation SUM, which generates the first to fourth sum signals SUM1 to SUM4 by adding the values of the first to fourth phase difference detection signals O<1:4> stored through the first to fourth storage operations SAVE1 to SAVE4, may be performed during a determined duration, for example, a duration when the value of the counting signal CNT is 25.

A comparing and adjusting operation CMP&ADJ, which performs phase adjustment by comparing the first to fourth sum signals SUM1 to SUM4 with each other, may be performed during a determined duration, for example, a duration when the value of the counting signal CNT is 26 to 27.

The value of the counting signal CNT may be initialized by the reset signal RST after the comparing and adjusting operation CMP&ADJ operation is performed.

The series of operation processes may be repeatedly performed until the phase differences between the plurality of second clock signals ICLK, QCLK, ICLKB, and QCLKB become within a target value.

Both of the operation methods of a clock compensation circuit described with reference to FIGS. 8 and 11 may be supported through the control logic circuit 196-3 of the phase error control circuit 190 and any one of the operation methods may be optionally used.

Figure 12:
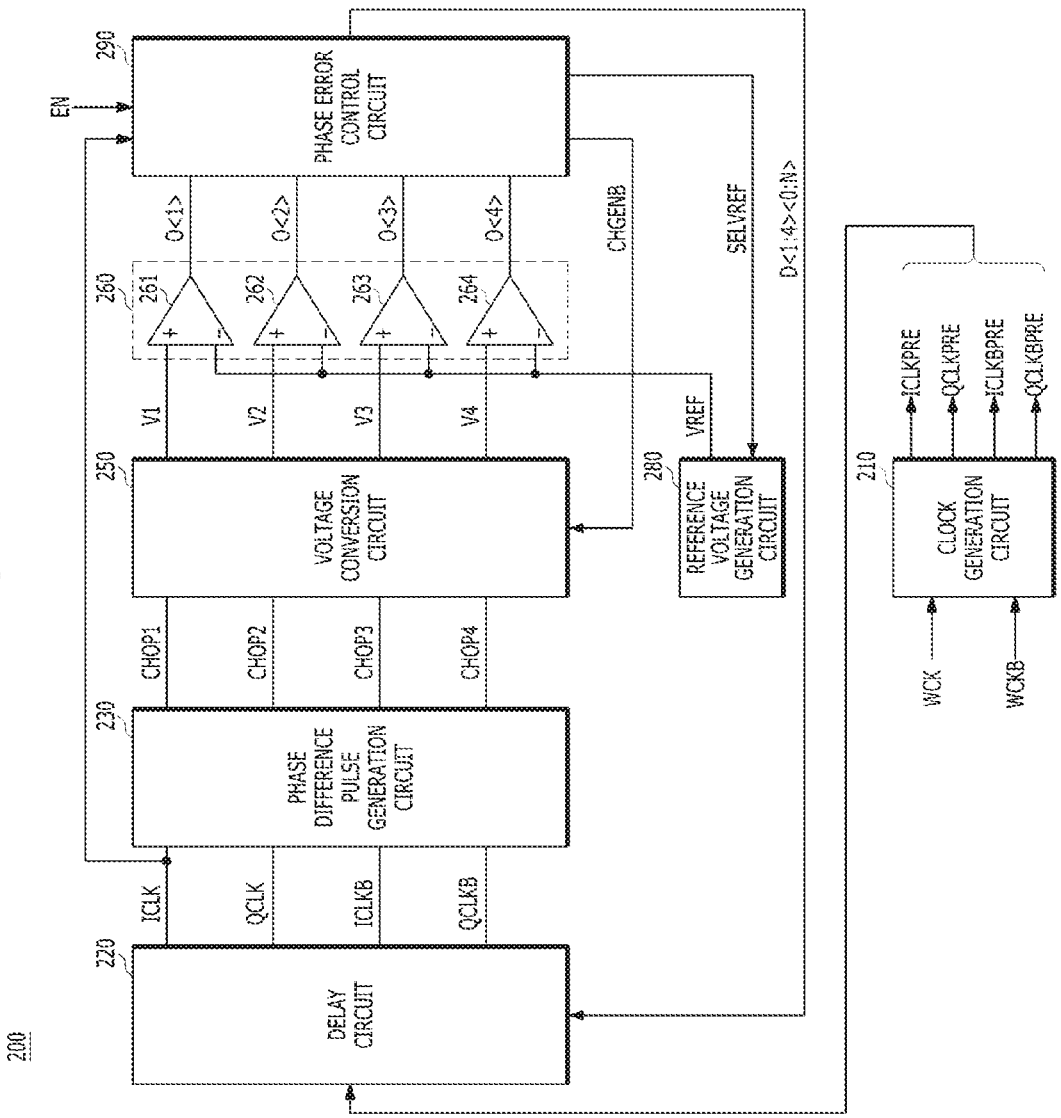
FIG. 12 is a diagram illustrating a configuration of a clock compensation circuit according to another embodiment of the present disclosure.

FIG. 12 is a diagram illustrating a configuration of a clock compensation circuit according to another embodiment.

Referring to FIG. 2, a clock compensation circuit 200 may include a delay circuit 220, a phase difference pulse generation circuit 230, a voltage conversion circuit 250, a comparison circuit 260, a reference voltage generation circuit 280, and a phase error control circuit 290.

The delay circuit 220 may generate a plurality of second clock signals ICLK, QCLK, ICLKB, and QCLKB by independently delaying a plurality of first clock signals ICLKPRE, QCLKPRE, ICLKBPRE, and QCLKBPRE by times adjusted according to delay control signals D<1:4><0:N>.

The phase difference pulse generation circuit 230 may generate pulses corresponding to phase differences between the plurality of second clock signals ICLK, QCLK, ICLKB, and QCLKB and output the generated pulses as first to fourth phase difference pulses CHOP1 to CHOP4.

The voltage conversion circuit 250 may convert the first to fourth phase difference pulses CHOP1 to CHOP4 into voltages according to a voltage conversion control signal CHGENB and output the converted voltages as first to fourth phase difference voltages V1, V2, V3, and V4.

The comparison circuit 260 may generate first to fourth phase difference detection signals O<1:4> by comparing the first to fourth phase difference voltages V1 to V4 with a reference voltage VREF.

The comparison circuit 260 may include first to fourth comparators 261 to 264.

The first comparator 261 may generate a first phase difference detection signal O<1> by comparing the first phase difference voltage V1 with the reference voltage VREF.

The second comparator 262 may generate a second phase difference detection signal O<2> by comparing the second phase difference voltage V2 with the reference voltage VREF.

The third comparator 263 may generate a third phase difference detection signal O<3> by comparing the third phase difference voltage V3 with the reference voltage VREF.

The second comparator 264 may generate a fourth phase difference detection signal O<4> by comparing the fourth phase difference voltage V4 with the reference voltage VREF.

The reference voltage generation circuit 280 may generate a plurality of voltage levels, select one of the plurality of voltage levels according to a reference voltage selection signal SELVREF, and output the selected voltage level as the reference voltage REF.

The phase error control circuit 290 may generate a plurality of control signals according to any one of the plurality of second clock signals ICLK, QCLK, ICLKB, and QCLKB, for example, second clock signal ICLK and the first to fourth phase difference detection signals O<1:4>.

The plurality of control signals may include the reference voltage selection signal SELVREF, the voltage conversion control signal CHGENB, and the delay control signals D<1:4><0:N>.

The phase error control circuit 290 may be activated according to an enable signal EN to perform an operation of generating the plurality of control signals.

The enable signal EN may be provided from an external apparatus, for example, a semiconductor device including the clock compensation circuit 200, a memory controller configured to control the semiconductor device, and the like.

The external apparatus may optionally activate the enable signal EN according to various operation conditions including power-up of the semiconductor device, a mode register input of the semiconductor device, a specific command (for example, a self-refresh exit command), and the like.

The phase error control circuit 290 may monitor variations of the first to fourth phase difference detection signals O<1:4> while adjusting the level of the reference voltage VREF using the reference voltage selection signal SELVREF and adjust the values of the delay control signals D<1:4><0:N> so that the phase errors of the plurality of second clock signals ICLK, QCLK, ICLKB, and QCLKB are compensated according to a monitoring result.

The clock compensation circuit 200 may further include a clock generation circuit 210.

The clock generation circuit 210 may generate the plurality of first clock signals ICLKPRE, QCLKPRE, ICLKBPRE, and QCLKBPRE using external clock signals WCK and WCKB.

The external clock signals WCK and WCKB may be provided from an external apparatus, for example, a semiconductor device including the clock compensation circuit 200, a memory controller configured to control the semiconductor device, and the like.

The delay circuit 220, the comparison circuit 260, the reference voltage generation circuit 280, the phase error control circuit 290, and the clock generation circuit 210 may have the same configurations as the delay circuit 120, the comparison circuit 160, the reference voltage generation circuit 180, the phase error control circuit 190, and the clock generation circuit 110 of FIG. 1.

Figure 13:
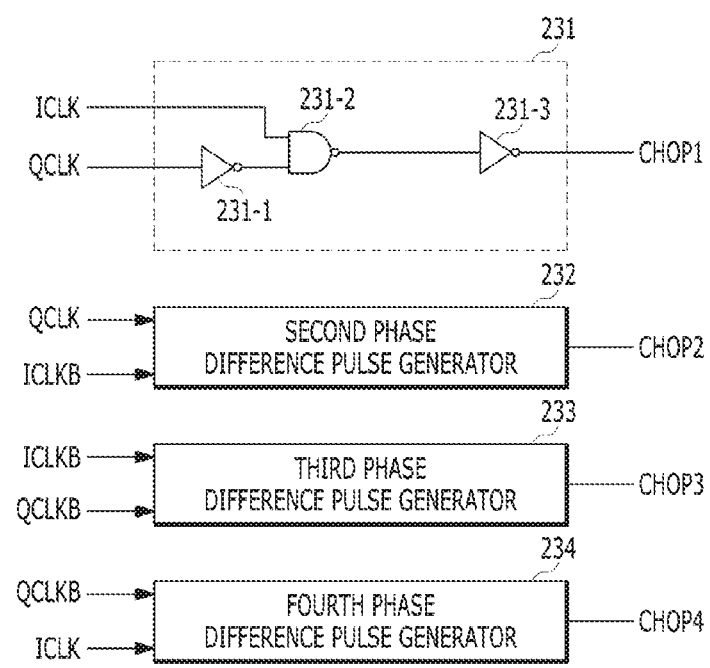
FIG. 13 is a diagram illustrating a configuration of a phase difference pulse generation circuit of FIG. 12.

FIG. 13 is a diagram illustrating a configuration of the phase difference pulse generation circuit 230 of FIG. 12.

Referring to FIG. 13, the phase difference pulse generation circuit 230 may include first to fourth phase difference pulse generators 231 to 234.

The first phase difference pulse generator 231 may receive the second clock signals ICLK and QCLK of the plurality of second clock signals ICLK, QCLK, ICLKB, and QCLKB and generate the first phase difference pulse CHOP1 corresponding to a phase difference between the second clock signals ICLK and QCLK.

The first phase difference pulse generator 231 may include a first inverter 2314, a NAND gate 231-2, and a second inverter 231-3.

The first inverter 231-1 may invert the second clock signal QCLK and output an inverting result.

The NAND gate 231-2 may perform a logic NAND operation on the second clock signal ICLK and an output of the first inverter 231-1 and output a logic NAND-operated result.

The second inverter 231-3 may invert an output of the NAND gate 231-2 and output an inverting result as the first phase difference pulse CHOP1.

The second phase difference pulse generator 232 may receive the second clock signals QCLK and ICLKB of the plurality of second clock signals ICLK, QCLK, ICLKB, and QCLKB and generate the second phase difference pulse CHOP2 corresponding to a phase difference between the second clock signals QCLK and ICLKB.

The third phase difference pulse generator 233 may receive the second clock signals ICLKB and QCLKB of the plurality of second clock signals ICLK, QCLK, ICLKB, and QCLKB and generate the third phase difference pulse CHOP3 corresponding to a phase difference between the second clock signals ICLKB and QCLKB.

The fourth phase difference pulse generator 234 may receive the second clock signals QCLKB and ICLK of the plurality of second clock signals ICLK, QCLK, ICLKB, and QCLKB and generate the fourth phase difference pulse CHOP4 corresponding to a phase difference between the second clock signals QCLKB and ICLK.

The second to fourth phase difference pulse generators 232 to 234 may have the same configurations as the first phase difference pulse generator 231.

Figure 14:
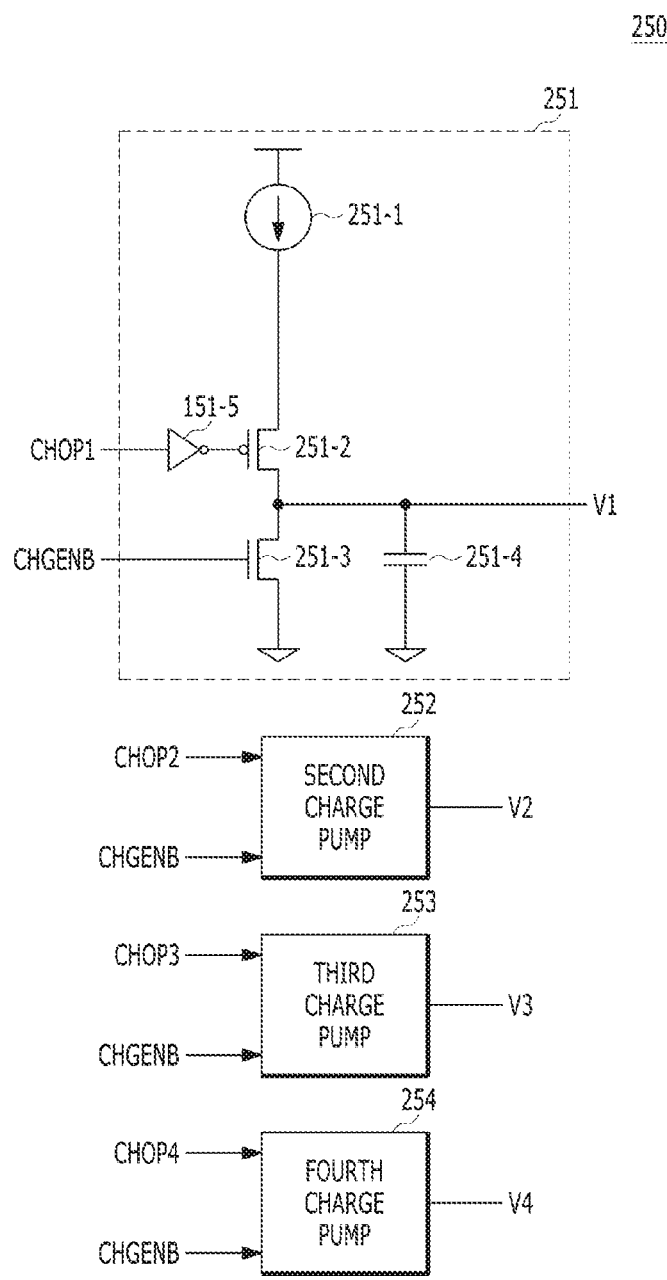
FIG. 14 is a diagram illustrating a configuration of a voltage conversion circuit of FIG. 12.

FIG. 14 is a diagram illustrating a configuration of the voltage conversion circuit 250 of FIG. 12.

Referring to FIG. 14, the voltage conversion circuit 250 may include first to fourth charge pumps 251 to 254.

The first charge pump 251 may perform a charge pumping operation according to the first phase difference pulse CHOP1 and the voltage conversion control signal CHGENB and output a voltage level charged through the charge pumping operation as the first phase difference voltage V1.

The first charge pump 251 may include a current source 251-1, first and second transistors 251-2 and 251-3, a capacitor 351-4, and inverter 251-5.

The inverter 251-5 may invert the first phase difference pulse CHOP1 and output an inverting result.

A source of the first transistor 251-2 may be coupled to the current source 251-1 and a gate of the first transistor 251-2 may receive an output of the inverter 251-5.

A drain of the second transistor 251-3 may be coupled to a drain of the first transistor 251-2, a gate of the second transistor 251-3 may receive the voltage conversion control signal CHGENB, and a source of the second transistor 251-3 may be coupled to the ground terminal.

The capacitor 251-4 may be coupled to a node to which the first transistor 251-2 and the second transistor 251-3 are coupled and the ground terminal.

A voltage charged in the capacitor 151-4 may be output as the first phase difference voltage V1.

The second charge pump 252 may perform a charge pumping operation according to the second phase difference pulse CHOP2 and the voltage conversion control signal CHGENB and outputs a voltage level charged through the charge pumping operation as the second phase difference voltage V2.

The third charge pump 253 may perform a charge pumping operation according to the third phase difference pulse CHOP3 and the voltage conversion control signal CHGENB and outputs a voltage level charged through the charge pumping operation as the third phase difference voltage V3.

The fourth charge pump 254 may perform a charge pumping operation according to the fourth phase difference pulse CHOP4 and the voltage conversion control signal CHGENB and outputs a voltage level charged through the charge pumping operation as the fourth phase difference voltage V4.

The second to fourth charge pumps 252 to 254 may have the same configurations as the first charge pump 251.

FIGS. 15 and 16 are diagrams for describing a phase error compensation method of a clock compensation circuit according to another embodiment.

A phase error compensation method of a clock compensation circuit according to another embodiment will be described with reference to FIGS. 15 and 16 below.

First, an operation of the clock compensation circuit in an ideal case where the phase differences between the plurality of second clock signals ICLK, QCLK, ICLKB, and QCLKB match a target value will be described with reference to FIG. 15.

Referring to FIG. 15, in the ideal case where the phase differences between the plurality of second clock signals ICLK, QCLK, ICLKB, and QCLKB match the target value, the phase differences between the first to fourth phase difference pulses CHOP1 to CHOP4 may also have a constant value.

The values of the first to fourth phase difference detection signals O<1:4> detected in a case where the reference voltage VREF has the first level may be '0000'. The values of the first to fourth phase difference detection signals O<1:4> detected in a case where the reference voltage VREF has the second level may be '0000'. The values of the first to fourth phase difference detection signals O<1:4> detected in a case where the reference voltage VREF has the third level may be '1111'. The values of the first to fourth phase difference detection signals O<1:4> detected in a case where the reference voltage VREF has the fourth level may be '1111'.

All of a value of the first sum signal SUM1 for which the values of the first phase difference detection signal O<1> for the levels of the reference voltage VREF are added, a value of the second sum signal SUM2 for which the values of the second phase difference detection signal O<2> for the levels of the reference voltage VREF are added, a value of the third sum signal SUM3 for which the values of the third phase difference detection signal O<3> for the levels of the reference voltage VREF are added, and a value of the fourth sum signal SUM4 for which the values of the fourth phase difference detection signal O<4> for the levels of the reference voltage VREF are added are equally '2'.

Because the minimum value of the values of the first to fourth sum signals SUM1 to SUM4 is '2', the values with '2' subtracted from the values of the first to fourth sum signals SUM1 to SUM4 become '0'.

The meaning that the values which subtract '2' as the minimum value from the values of the first to fourth sum signals SUM1 to SUM4 are '0' may represent that the phase adjustment is unnecessary.

Accordingly, the phase error control circuit 290 might not perform the phase adjustment operation ADJ on the plurality of second clock signals ICLK, QCLK, ICLKB, and QCLKB.

Next, an operation of a clock compensation circuit in a case where the phase differences between the plurality of second clock signals ICLK, QCLK, ICLKB, and QCLKB are deviated from the target value and the phase errors exist will be described with reference to FIG. 16.

Referring to FIG. 16, when the phase errors between the plurality of second clock signals ICLK, QCLK, ICLKB, and QCLKB exist, the phase errors between the first to fourth phase difference pulses CHOP1 to CHOP4 may also occur.

The values of the first to fourth phase difference detection signals O<1:4> detected in a case where the reference voltage VREF has the first level may be '0000'. The values of the first to fourth phase difference detection signals O<1:4> detected in a case where the reference voltage VREF has the second level may be '1000'. The values of the first to fourth phase difference detection signals O<1:4> detected in a case where the reference voltage VREF has the third level may be '1011'. The values of the first to fourth phase difference detection signals O<1:4> detected in a case where the reference voltage VREF has the fourth level may be '1111'.

A value of the first sum signal SUM1 for which the values of the first phase difference detection signal O<1> for the levels of the reference voltage VREF are added is '3', a value of the second sum signal SUM2 for which the values of the second phase difference detection signal O<2> for the levels of the reference voltage VREF are added is '1', a value of the third sum signal SUM3 for which the values of the third phase difference detection signal O<3> for the levels of the reference voltage VREF are added is '2', and a value of the fourth sum signal SUM4 for which the values of the fourth phase difference detection signal O<4> for the levels of the reference voltage VREF are added is '2'.

Because the minimum value of the values of the first to fourth sum signals SUM1 to SUM4 is '1', the values with '1' subtracted from the values of the first to fourth sum signals SUM1 to SUM4 are '2, 0, 1, 1'.

The phase error control circuit 290 may adjust the values of the delay control signals D<1:4><0:N> so that the phase adjustment is performed by '2, 0, 1, 1' with respect to the plurality of second clock signals ICLK, QCLK, ICLKB, and QCLKB.

The embodiments described above are intended to illustrate and not to limit the present teachings. Various alternatives and equivalents are possible. The present teachings are not limited by the embodiments described herein. Nor are the present teachings limited to any specific type of semiconductor device. Other additions, subtractions, or modifications are possible in view of the present disclosure and are intended to fall within the scope of the appended claims.

What is claimed is:

1. A clock compensation circuit comprising:
a delay circuit configured to generate a plurality of second clock signals by delaying a plurality of first clock signals;
a voltage conversion circuit configured to convert phase differences between the plurality of second clock signals into voltages and output converted voltages as a plurality of phase difference voltages;
a comparison circuit configured to generate a plurality of phase difference detection signals by comparing the plurality of phase difference voltages with a reference voltage; and
a phase error control circuit configured to generate a plurality of control signals for controlling the delay circuit, the voltage conversion circuit, and the comparison circuit according to any of the plurality of second clock signals and the plurality of phase difference detection signals.

2. The clock compensation circuit of claim 1, wherein the delay circuit includes a plurality of delay units configured to output the plurality of second clock signals by independently delaying the plurality of first clock signals.

3. The clock compensation circuit of claim 1, wherein the voltage conversion circuit includes a plurality of charge pumps, each charge pump configured to:
perform a charge pumping operation according to a phase difference between second clock signals selected among the plurality of second clock signals; and
output a voltage level charged through the charge pumping operation as one of the plurality of phase difference voltages.

4. The clock compensation circuit of claim 1, wherein the phase error control circuit is configured to:
monitor phase errors between the plurality of second clock signals while adjusting a level of the reference voltage; and
adjust a delay time of the delay circuit so that the phase errors are compensated according to a monitoring result.

5. The clock compensation circuit of claim 1, wherein the phase error control circuit includes:
a plurality of summers configured to sequentially store values of the plurality of phase difference detection signals detected according to reference voltages of different levels and generate a plurality of sum signals by adding stored values of the plurality of phase difference detection signals;
a counting circuit configured to generate a counting signal by counting one of the plurality of second clock signals; and
a control signal generation circuit configured to generate the plurality of control signals in response to the counting signal and the plurality of sum signals.

6. The clock compensation circuit of claim 5, wherein the control signal generation circuit includes:
a decoding logic circuit configured to generate a decoding signal by decoding the counting signal;
a storage logic circuit configured to store the plurality of sum signals; and
a control logic circuit configured to determine whether or not the phase errors are compensable according to the delay time of the delay circuit and generate the plurality of control signals by recognizing an operation timing according to the decoding signal.

7. The clock compensation circuit of claim 6, wherein the control logic circuit is configured to:
detect a minimum value of values of the plurality of sum signals by comparing the values of the plurality of sum signals with each other; and
adjust the delay time of the delay circuit to match a value that subtracts the minimum value from each of the values of the plurality of sum signals.

8. The clock compensation circuit of claim 1, further comprising a reference voltage generation circuit configured to:
generate a plurality of voltage levels; and
output one of the plurality of voltage levels as the reference voltage.

9. The clock compensation circuit of claim 1, further comprising a clock generation circuit configured to generate the plurality of first clock signals using an external clock signal.

10. A clock compensation circuit comprising:

a delay circuit configured to generate a plurality of second clock signals by delaying a plurality of first clock signals according to a delay control signal;

a voltage conversion circuit configured to convert phase differences between the plurality of second clock signals into voltages according to a voltage conversion control signal and output converted voltages as a plurality of phase difference voltages;

a comparison circuit configured to generate a plurality of phase difference detection signals by comparing the plurality of phase difference voltages with a reference voltage; and a phase error control circuit configured to monitor variations of the plurality of phase difference detection signals while adjusting a level of the reference voltage using a reference voltage selection signal and adjust a value of the delay control signal so that phase errors of the plurality of second clock signals are compensated according to a monitoring result.

11. The clock compensation circuit of claim 10, wherein the delay circuit includes a plurality of delay units configured to output the plurality of second clock signals by independently delaying the plurality of first clock signals according to the delay control signal.

12. The clock compensation circuit of claim 10, wherein the voltage conversion circuit includes a plurality of charge pumps, each charge pump configured to:

perform a charge pumping operation according to a phase difference between second clock signals selected among the plurality of second clock signals; and output a voltage level charged through the charge pumping operation as one of the plurality of phase difference voltages.

13. The clock compensation circuit of claim 10, wherein the phase error control circuit includes:

a plurality of summers configured to sequentially store values of the plurality of phase difference detection signals detected according to reference voltages of different levels in response to the reference voltage selection signal and generate a plurality of sum signals by adding stored values of the plurality of phase difference detection signals;

a counting circuit configured to generate a counting signal by counting one of the plurality of second clock signals in response to a loop start signal; and a control signal generation circuit configured to generate the delay control signal, the loop start signal, the reference voltage selection signal, and the voltage conversion control signal in response to an enable signal, the counting signal, and the plurality of sum signals.

14. The clock compensation circuit of claim 13, wherein the control signal generation circuit includes:

a decoding logic circuit configured to generate a decoding signal by decoding the counting signal;

a storage logic circuit configured to store the plurality of sum signals; and a control logic circuit configured to generate the loop start signal by determining whether or not the phase errors are compensable according to the delay control signal, generate the reference voltage selection signal and the voltage conversion control signal by recognizing an operation timing according to the decoding signal, and generate the delay control signal according to the plurality of sum signals.

15. The clock compensation circuit of claim 14, wherein the control logic circuit is configured to:

detect a minimum value of values of the plurality of sum signals by comparing the values of the plurality of sum signals with each other; and generate the delay control signal to match a value that subtracts the minimum value from each of the values of the plurality of sum signals.

16. The clock compensation circuit of claim 14, wherein the control logic circuit is configured to optionally perform:

an operation of generating the loop start signal by determining the phase errors are compensable according to the delay control signal; and an operation of generating the loop start signal by converting the phase errors into a compensable state by initializing the delay control signal according to the enable signal.

17. The clock compensation circuit of claim 10, further comprising a reference voltage generation circuit configured to:

generate a plurality of voltage levels;

select one of the plurality of voltage levels according to the reference voltage selection signal; and output a selected voltage level as the reference voltage.

18. The clock compensation circuit of claim 10, further comprising a clock generation circuit configured to generate the plurality of first clock signals using an external clock signal.

19. A clock compensation circuit comprising:

a delay circuit configured to generate a plurality of second clock signals by delaying a plurality of first clock signals according to a delay control signal;

a phase difference pulse generation circuit configured to output pulses corresponding to phase differences between the plurality of second clock signals as a plurality of phase difference pulses;

a voltage conversion circuit configured to convert the plurality of phase difference pulses into voltages according to a voltage conversion control signal and output converted voltages as a plurality of phase difference voltages;

a comparison circuit configured to generate a plurality of phase difference detection signals by comparing the plurality of phase difference voltages with a reference voltage; and a phase error control circuit configured to monitor variations of the plurality of phase difference detection signals while adjusting a level of the reference voltage using a reference voltage selection signal and adjust a value of the delay control signal so that phase errors of the plurality of second clock signals are compensated according to a monitoring result.

20. The clock compensation circuit of claim 19, wherein the voltage conversion circuit includes a plurality of charge pumps configured to:

perform a charge pumping operation according to the plurality of phase difference pulses; and output voltage levels charged through the charge pumping operation as the plurality of phase difference voltages.

21. The clock compensation circuit of claim 19, wherein the phase error control circuit includes:

a plurality of summers configured to sequentially store values of the plurality of phase difference detection signals detected according to reference voltages of different levels in response to the reference voltage selection signal and generate a plurality of sum signals by adding stored values of the plurality of phase difference detection signals;

a counting circuit configured to generate a counting signal by counting one of the plurality of second clock signals in response to a loop start signal; and a control signal generation circuit configured to generate the delay control signal, the loop start signal, the reference voltage selection signal, and the voltage conversion control signal in response to an enable signal, the counting signal, and the plurality of sum signals.

22. The clock compensation circuit of claim 21, wherein the control signal generation circuit includes:

a decoding logic circuit configured to generate a decoding signal by decoding the counting signal;

a storage logic circuit configured to store the plurality of sum signals; and a control logic circuit configured to generate the loop start signal by determining whether or not the phase errors are compensable according to the delay control signal, generate the reference voltage selection signal and the voltage conversion control signal by recognizing an operation timing according to the decoding signal, and generate the delay control signal according to the plurality of sum signals.

23. The clock compensation circuit of claim 22, wherein the control logic circuit is configured to:

detect a minimum value of values of the plurality of sum signals by comparing the value of the plurality of sum signals with each other; and generate the delay control signal to match a value that subtracts the minimum value from each of the values of the plurality of sum signals.

24. The clock compensation circuit of claim 22, wherein the control logic circuit is configured to optionally perform:

an operation of generating the loop start signal by determining the phase errors are compensable according to the delay control signal; and an operation of generating the loop start signal by converting the phase errors into a compensable state by initializing the delay control signal according to the enable signal.

* * * * *